United States Patent [19]
Kikkawa

[11] Patent Number: 6,020,604
[45] Date of Patent: Feb. 1, 2000

[54] COMPOUND SEMICONDUCTOR DEVICE

[75] Inventor: Toshihide Kikkawa, Kawasaki, Japan

[73] Assignee: Fujitsu Limited, Kawasaki, Japan

[21] Appl. No.: 08/977,716

[22] Filed: Nov. 25, 1997

[30] Foreign Application Priority Data

Mar. 13, 1997 [JP] Japan .................................. 9-058695

[51] Int. Cl.⁷ .............................................. H01L 31/0328
[52] U.S. Cl. ......................... 257/190; 257/191; 257/192; 257/194
[58] Field of Search .................................. 257/190, 191, 257/192, 194

[56] References Cited

U.S. PATENT DOCUMENTS

| | | | |
|---|---|---|---|
| 5,331,410 | 7/1994 | Kuwata ................................... | 257/192 |
| 5,367,183 | 11/1994 | Perer et al. .............................. | 257/194 |
| 5,449,928 | 9/1995 | Matsugatami et al. ................. | 257/194 |
| 5,495,115 | 2/1996 | Kudo et al. .............................. | 257/190 |
| 5,610,410 | 3/1997 | Imanishi ................................... | 257/76 |
| 5,650,642 | 7/1997 | Sawada et al. .......................... | 257/192 |
| 5,701,020 | 12/1997 | Liu et al. ................................. | 257/192 |

FOREIGN PATENT DOCUMENTS 3-22541   1/1991   Japan ............................. H01L 2/338

*Primary Examiner*—Olik Chaudhuri
*Assistant Examiner*—Douglas A. Wille
*Attorney, Agent, or Firm*—Armstrong, Westerman, Hattori, McLeland & Naughton

[57] ABSTRACT

A compound semiconductor device including a semi-insulating GaAs substrate; an electron transit layer consisting of an InGaAs layer formed on the substrate; a mitigation layer formed on the electron transit layer, and consisting of an AlGaInAs layer; and a barrier layer formed on the mitigation layer, consisting of an AlGaAs layer, and having a higher Al composition ratio than the mitigation layer. Crystal defects in the barrier layer can be reduced, and the compound semiconductor device can have large gains. The barrier layer and the mitigation layers are so thin that a gate voltage sufficiently influences the electron transit layer, and the compound semiconductor device can have a threshold voltage higher than 0V.

12 Claims, 5 Drawing Sheets

COMPOUND SEMICONDUCTOR DEVICE

BACKGROUND OF THE INVENTION

1. Field of the Invention

The present invention relates to a compound semiconductor device for use in power amplifiers or others of movable communication terminals.

2. Description of the Related Art

In terminals of communication movable bodies, such as portable telephones, etc. MESFETs using GaAs, which are capable of high-speed operation, are used as parts of power amplifiers of the transmission units.

In the conventional MESFETs, however, a threshold voltage is lower than 0 V, and even with a gate voltage set at 0 V, drain current is not completely turned off, and a trace of drain leak current of tenth-order $\mu$A flows. Even a trace of drain leak current is a cause for short battery life for portable telephones, which are long in waiting state without communication (waiting time).

The drain leak current of the MESFET can be made null by applying a high negative voltage to the gate electrode, but to this end separate batteries for generating a negative voltage are necessary. Mounting a plurality of batteries causes a volume increase and a cost increase unpreferably in terms of properties of the movable body terminal.

In place of mounting extra batteries for generating the negative voltage, it can be proposed that a DC/DC converter is mounted for generating the negative voltage, but this is not preferable because more current than the drain leak current is consumed by the DC/DC converter.

It has therefore been proposed that a switch transistor which operates at a positive voltage should be inserted in the drain terminal of the MESFET, whereby the drain current is shut off.

However, when the switch transistor operates, and a current flows between the collector and the emitter, a voltage decrease takes place between the collector and the emitter, and the voltage decrease becomes larger as the flowing current is increased. Accordingly, a voltage to be applied to the drain electrode of the MESFET adversely lowers. To maintain the same output electric power as in the prior art, a voltage decrease must be supplied by increasing current. In addition, to decrease electric power consumption of the terminal of the communication movable body, the electric power source voltage is lowered, which makes the voltage decrease of the switch transistor more serious.

Therefore, a compound semiconductor device which does not require insertion of a switch transistor has been proposed.

The proposed compound semiconductor device will be explained with reference to FIG. 5. FIG. 5 is a sectional view of the proposed compound semiconductor device.

In the proposed compound semiconductor device, a thin barrier layer is used to facilitate influence of the gate voltage on the electron transit layer to thereby make the threshold voltage higher than 0 V.

A 600 nm-thickness buffer layer 212 of GaAs is formed on a semi-insulating GaAs substrate 210, and a 14 nm-thickness electron transit layer 214 of $In_{0.2}Ga_{0.8}As$ is formed on the buffer layer 212.

A 20 nm-thickness barrier layer 218 of $Al_{0.75}Ga_{0.25}As$ is formed on the electron transit layer 214. Because there is a tendency that a decrease of a thickness of the barrier layer 218 increases the gate leak current, the barrier layer 218 is formed of a material having a high Al composition ratio to prevent increase of the gate leak current.

A 30 nm-thickness GaAs layer 220 is formed on the barrier layer 218 for good contact with the respective electrodes.

A gate electrode 222 is formed on the GaAs layer 220, and a source electrode 224 and a drain electrode 226 are formed on both sides of the gate electrode 222.

In regions below the source electrode 224 and the drain electrode 226, ohmic regions 228, 230 heavily doped with an n-impurity are formed down to the semi-insulating GaAs substrate 210.

For preventing concentration of an electric field between the ohmic regions 228, 230 and the region undoped with the impurity, LDD (Lightly Doped Drain) regions 232, 234 which reach the semi-insulating GaAs substrate 210 are formed in the region other than the region below the gate electrode 222.

As described above, the proposed semiconductor device includes the barrier layer 218 having the high Al composition ratio and a small thickness, whereby the threshold voltage can be greater than 0 V, so that the drain current can be OFF without applying a negative voltage to the gate electrode.

However, the above-described proposed compound semiconductor device, which includes the barrier layer 218 having the high Al composition ratio on the Al-free electron transit layer 214, has such a poor junction of the interface between the electron transit layer 214 and the barrier layer 218 that the barrier layer 218 has many crystal defects. As a result, the proposed compound semiconductor device unpractically has a small gain and low reliability.

SUMMARY OF THE INVENTION

An object of the present invention is to provide a compound semiconductor device having a high threshold voltage and large gain.

The above-described object is achieved by a compound semiconductor device comprising: a semi-insulating GaAs substrate; an electron transit layer of an InGaAs layer formed on the substrate; a mitigation layer formed on the electron transit layer, and being an AlGaInAs layer; and a barrier layer formed on the mitigation layer, being an AlGaAs layer, and having a higher Al composition ratio than the mitigation layer. Crystal defects of the barrier layer can be reduced, and the compound semiconductor device can have a large gain. The barrier layer and the mitigation layers are so thin that a gate voltage sufficiently influences the electron transit layer, and the compound semiconductor device can have a threshold voltage greater than 0 V.

In the above-described compound semiconductor device, it is preferable that the mitigation layer is as thin as about 10 nm, and the barrier layer is as thin as about 20 nm.

The above-described object is achieved by a compound semiconductor layer comprising: a semi-insulating InP substrate; an electron transit layer formed on the substrate, and being an InGaAs layer; a mitigation layer formed on the electron transit layer, and being an AlGaInAs layer; and a barrier layer formed on the mitigation layer, being an AlInAs layer, and having a higher Al composition ratio than the mitigation layer. Crystal defects of the barrier layer can be reduced, and the compound semiconductor device can have large gains. The barrier layer and the mitigation layers are so thin that a gate voltage sufficiently influences the electron transit layer, and the compound semiconductor device can have a threshold voltage higher than 0 V.

In the above-described compound semiconductor device, it is preferable that the mitigation layer is as thin as about 10 nm, and the barrier layer is as thin as about 40 nm.

In the above-described compound semiconductor device, it is preferable that the barrier layer is doped with no impurity.

In the above-described compound semiconductor device, it is preferable that the barrier layer is doped with an p-impurity, and a concentration of the impurity is below $1 \times 10^{19}$ cm$^{-3}$.

In the above-described compound semiconductor device, it is preferable that the electron transit layer has an In composition ratio increased toward the mitigation layer.

In the above-described compound semiconductor device, it is preferable that the electron transit layer is doped with an n-impurity, and a concentration of the impurity is below $2 \times 10^{18}$ cm$^{-3}$.

DETAILED DESCRIPTION OF THE PREFERRED EMBODIMENTS

[A First Embodiment]

Figure 1:
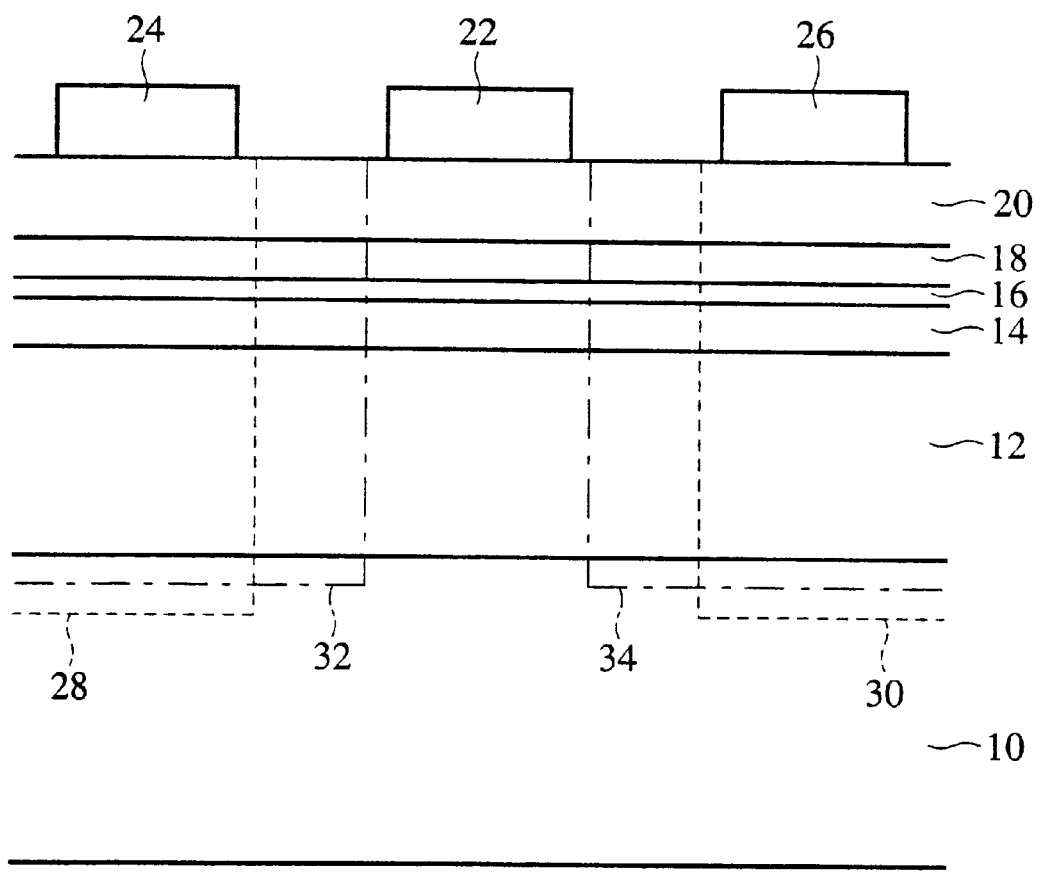
FIG. 1 is a sectional view of the compound semiconductor device according to the first embodiment of the present invention.
Figure 2:
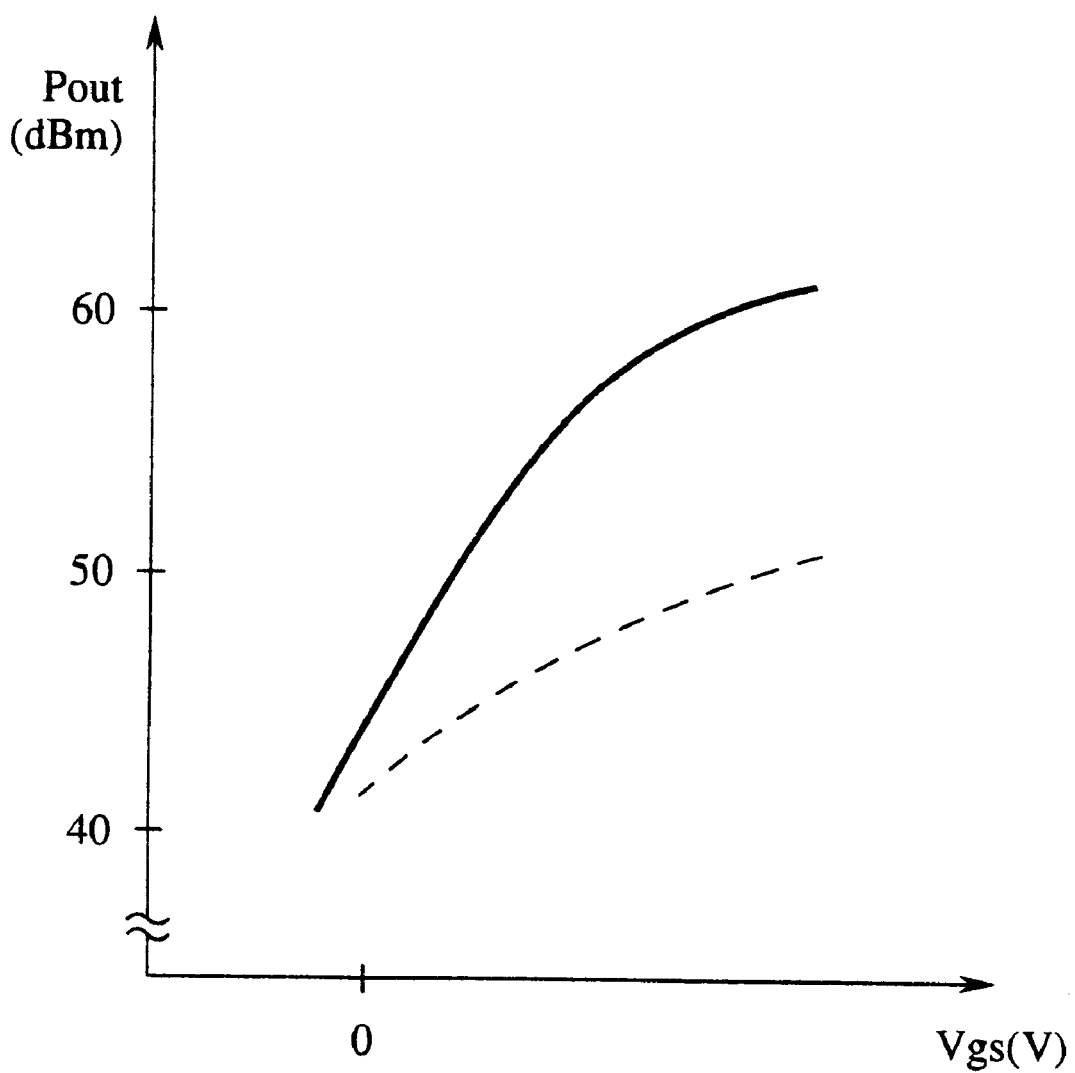
FIG. 2 is a graph of gain characteristics of the compound semiconductor device according to the first embodiment of the present invention.
Figure 3:
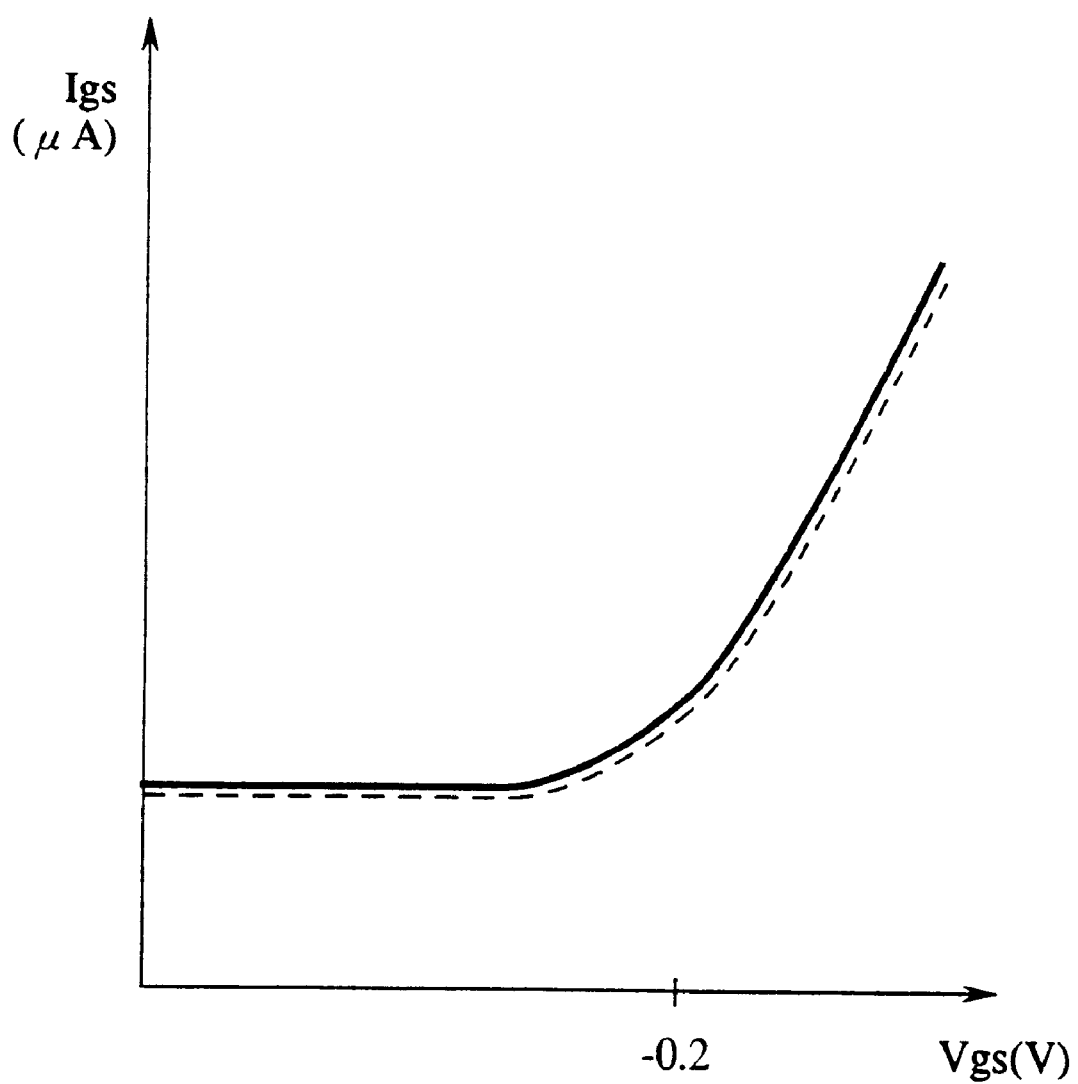
FIG. 3 is a graph of gate voltage-gate leak current characteristics of the compound semiconductor device according to the first embodiment of the present invention.

The compound semiconductor device according to a first embodiment of the present invention will be explained with reference to FIGS. 1 to 3. FIG. 1 is a sectional view of the compound semiconductor device according to a first embodiment. FIG. 2 is a graph of gain characteristics of the compound semiconductor device according to the first embodiment. FIG. 3 is a graph of gate voltage-gate leak current characteristics.

The compound semiconductor device according to the first embodiment of the present invention is characterized in that a mitigation layer having a low Al composition ratio is formed between an electron transit layer and a barrier layer for the purpose of suppressing occurrence of crystal defects of the barrier layer.

A 600 nm-thickness buffer layer 12 of GaAs is formed on a 3-inch diameter semi-insulating GaAs of crystal orientation (100) and misorientation angle 2.0°. A 14 nm-thickness $In_zGa_{1-z}As$ electon transit layer 14 having a 0.2 In composition ratio is formed on the buffer layer 12. The electron transit layer 14 is not doped with an impurity. An In composition ratio (z) of the electron transit layer 14 is higher than 0.1 and below 0.5.

A 5 nm-thickness mitigation layer 16 of $(Al_xGa_{1-x})_yIn_{1-y}As$ having an Al 0.25 composition ratio and an In 0.95 composition ratio (y) is formed on the electron transit layer 14. The mitigation layer 16, which has a low Al composition ratio, can form the interface between the electron transit layer 14 and the mitigation layer 16 good. An Al composition ratio (x) of the mitigation layer 16 is above 0.1 and below 0.5, and an In composition ratio (y) is above 0.9 and below 1.0. A thickness of the mitigation layer 16 is below 10 nm.

A 15 nm-thickness barrier layer 18 of $Al_xGa_{1-x}As$ having a 0.75 Al composition ratio (x) is formed on the mitigation layer 16. Because the gate leak current tends to increase as a thickness of the barrier layer 18 is decreased, a material having a high Al composition ratio (x) is used for the prevention of the gate leak current. Because of the mitigation layer 16 containing a trace of Al formed below the barrier layer 18, the junction with the barrier layer 18 containing Al is good, and crystal defects of the barrier layer 18 can be reduced. The barrier layer 18 is not doped with an impurity and preferably has a non-dope level of below $5 \times 10^{17}$ cm$^{-3}$. An Al composition ratio (x) of the barrier layer 18 is above 0.4 and below 0.8. A thickness of the barrier layer 18 is less than 30 nm.

The electron transit layer 14, the mitigation layer 16 and the barrier layer 18 are grown by MOVPE (Metal Organic Vapor Phase Epitaxial Growth System). A growth reactor is a low pressure horizontal reactor. A growth pressure is 76 Torr, and a substrate temperature is 660° C. As raw materials for Group III elements, TMG (Trimethylgallium) or TEG (Triethylgallium) is used for Ga, and TMAL (Trimethylaluminum) is used for Al, and TMI (Trimethylindium) is used for In. As a raw material for a V Group element, $AsH_3$ is used for As.

A 30 nm-thickness GaAs layer 20 is formed on the barrier layer 18, for good contact with the respective electrodes.

A gate electrode 22 having a 0.5 μm-gate length is formed on the GaAs layer 20. A source electrode 24 and a drain electrode 26 are formed on both sides of the gate electrode 22. Ohmic regions 28, 30 heavily doped with an n-impurity are formed in regions below the source electrode 24 and the drain electrode 26 down to the semi-insulating GaAs substrate 10.

For preventing concentration of an electric field between the ohmic regions 28, 30 and the region undoped with an impurity, LDD regions 32, 34 reaching the semi-insulating GaAs substrate 10 are formed, respectively, in regions except the region below the gate electrode 22.

Then, characteristics of the compound semiconductor device according to the first embodiment will be explained.

FIG. 2 is a graph of gate voltages taken on the horizontal axis and output electric power taken on the vertical axis. The solid line indicates gain characteristics of the compound semiconductor device according to the first embodiment, and the broken line indicates gain characteristics of the proposed compound semiconductor device. As shown in FIG. 2, the gain of the compound semiconductor device according to the present embodiment is very large in comparison with that of the proposed compound semiconductor device.

When relationships of drain currents with gate voltages are graphed with gate voltages taken on the horizontal axis and square roots of drain currents taken on the vertical axis, a substantially linear region is present. An inclination of the linear region is called a k value, and as a k value is larger, a gain is larger. When a gate voltage is 0.1 V, a k value of the proposed compound semiconductor device is 320 mA/V$^2$/mm. In contrast to this, a k value of the compound semiconductor device according to the first embodiment is 450 mA/V$^2$ /mm, and the gain is improved.

FIG. 3 is a graph of gate voltages taken on the horizontal axis and gate leak currents taken on the vertical axis. The solid line indicates gate leak current characteristics of the compound semiconductor device according to the first embodiment. The broken line indicates gate leak current characteristics of the proposed compound semiconductor device. The gate leak current characteristics of the compound semiconductor device according to the first embodiment are substantially equal to those of the proposed compound semiconductor device.

A source resistivity of the compound semiconductor device according to the first embodiment is 1.3 Ω·mm, and that of the proposed compound semiconductor device is 2 Ω·mm, which is improved to be very small.

A gate pressure-proof of the compound semiconductor device according to the first embodiment is 1.36 V, which is substantially equal to that of the proposed compound semiconductor device. The compound semiconductor device according to the first embodiment exhibits good characteristics.

The first embodiment, which includes the mitigation layer 16 having a low Al composition ratio (x) formed on the electron transit layer 14, and the barrier layer 18 having a high Al composition ratio formed on the mitigation layer 16, can reduce crystal defects of the barrier layer 18 and can provide a large gain as shown in FIG. 2. Because the barrier layer 18 is formed of a high Al content material, the barrier layer 18 can be made to be so thin, and the mitigation layer 16 is also made to be so thin that a gate voltage sufficiently influences the electron transit layer 14 to thereby make a threshold voltage greater higher than 0 V.

[A Second Embodiment]

Figure 4:
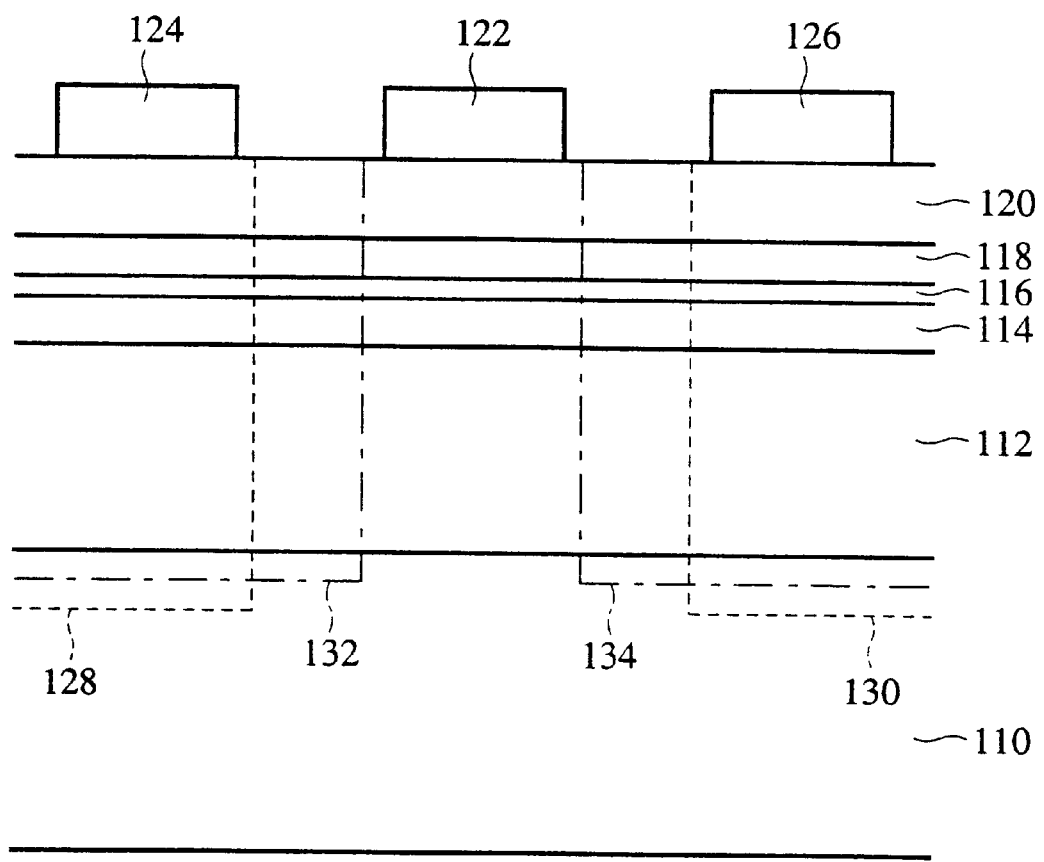
FIG. 4 is a sectional view of the compound semiconductor device according to the second embodiment of the present invention.
Figure 5:
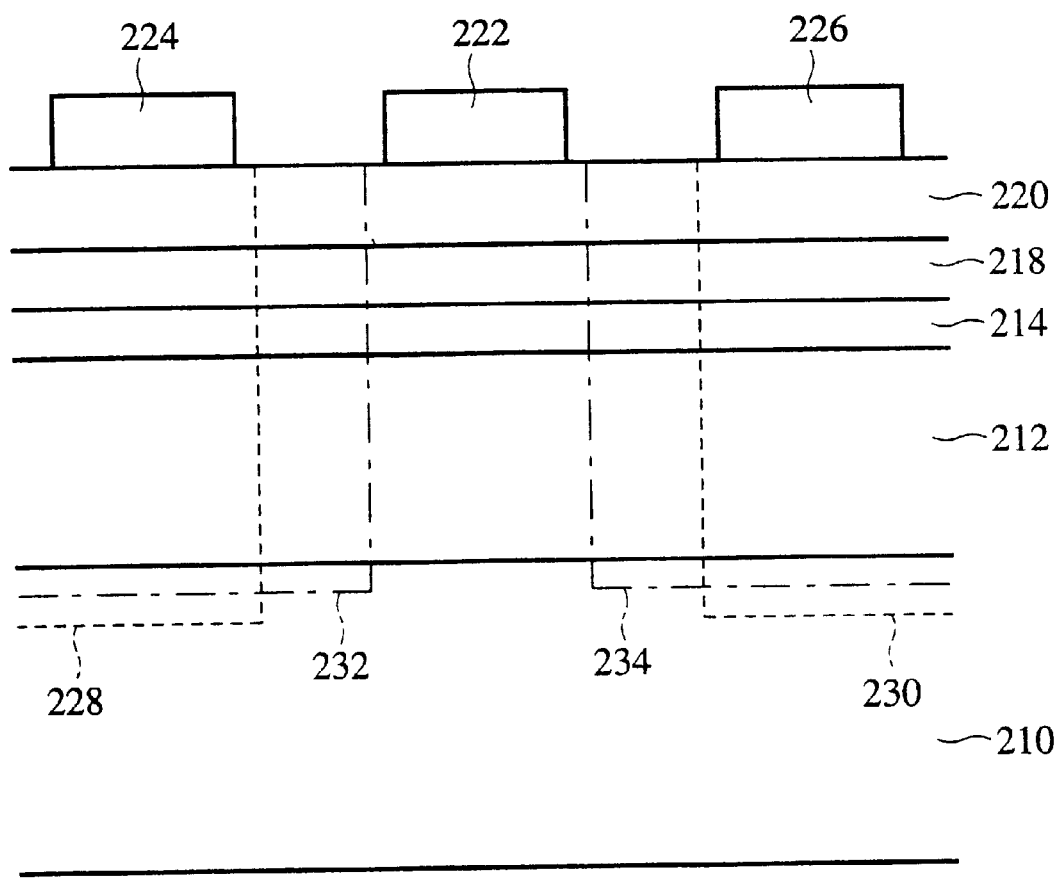
FIG. 5 is a sectional view of the proposed compound semiconductor device.

The compound semiconductor device according to a second embodiment of the first invention will be explained with reference to FIG. 4. FIG. 4 is a sectional view of the compound semiconductor device according to the first embodiment.

The compound semiconductor device according to the second embodiment is characterized by being formed of different materials from those of the compound semiconductor device according to the first embodiment.

A 600 nm-thickness buffer layer 112 of InP is formed on a semi-insulating InP substrate 110. On the buffer layer 112 a 20 nm-thickness electron transit layer 114 of $In_zGa_{1-z}As$ having a 0.45 In composition ratio (z) is formed. The electron transit layer 114 is not doped with an impurity. An In composition ratio (z) of the electron transit layer 114 is above 0.3 and below 0.7.

A 5 nm-thickness $(Al_xGa_{1-x})_yIn_{1-y}As$ mitigation layer 116 having a 0.3 Al composition ratio (x) and a 0.5 In composition ratio (y) is formed on the electron transit layer 114. The mitigation layer 116 whose Al composition ratio is low makes the interface between the electron transit layer 114 and the mitigation layer 116 good. An Al composition ratio (x) of the mitigation layer 116 is above 0.1 and below 0.35. An In composition ratio (y) of the mitigation layer 116 is above 0.3 and below 0.7. A thickness of the mitigation layer 116 is below 10 nm.

A 30 nm-thickness barrier layer 118 of $Al_xIn_{1-x}As$ having an 0.7 Al composition ratio (x) is formed on the mitigation layer 116. Because of the tendency that as the barrier layer 118 is made thinner, the gate leak current increases, a material having a high Al composition ratio is used for preventing gate current increase. The mitigation layer 116 containing a trace of Al is formed below the barrier layer 118 makes the junction with the barrier layer 118 good, whereby crystal defects of the barrier layer 118 can be reduced. The barrier layer 118 is not doped with an impurity, and a non-doped level is preferably below $5 \times 10^{17}$ cm$^{-3}$. An Al composition ratio (x) of the barrier layer 118 is above 0.3 and below 0.7. A thickness of the barrier layer 118 is below 40 nm.

The electron transit layer 114, the mitigation layer 116 and the barrier layer 118 are grown by MOVPE. A growth reactor is a low pressure horizontal reactor. A growth pressure is 76 Torr, and a substrate temperature is 660° C. As raw materials for III Group elements, TMG or TEG is used for Ga, TMAL is used for Al, and TMI is used for In. As a raw material for V Group elements, $AsH_3$ is used for As.

A 25 nm-thickness InP layer 120 is formed on the barrier layer 118 for good contact with the respective electrodes.

A gate electrode 122 of a 0.5 μm-gate length is formed on the InP layer 120, and a source electrode 124 and a drain electrode 126 are formed on both sides of the gate electrode 122. Ohmic regions 128, 130 heavily doped with an n-impurity are formed down to the semi-insulating InP substrate 110 in regions below the source electrode 124 and the drain electrode 126.

LDD regions 132, 134 are formed down to the semi-insulating InP substrate 110 respectively in regions except the region below the gate electrode 122 for preventing concentration of an electric field between the ohmic regions 128, 130 and the non-doped region.

Characteristics of the compound semiconductor device according to the second embodiment are the same as those of the compound semiconductor device according to the first embodiment.

The second embodiment, which includes the mitigation layer 116 having a low Al composition ratio (x) formed on the electron transit layer 114, and the barrier layer 118 having a high Al composition ratio formed on the mitigation layer 116, can reduce crystal defects of the barrier layer 118 and can provide large gains. Because the barrier layer 118 is formed of a high Al content material, the barrier layer 118 can be made to be so thin, and the mitigation layer 116 is also made to be so thin that a gate voltage sufficiently influences the electron transit layer 114 to thereby make a threshold voltage higher than 0 V.

[Modification]

The present invention covers various modifications in addition to the above-described embodiments.

For example, in the first and the second embodiments, a p-impurity may be added to the barrier layer so as to obtain high gate breakdown voltage. A concentration of the impurity is $1 \times 10^{\cdot}$cm$^{-3}$.

In the first and the second embodiments an In composition ratio (z) of the electron transit layer may be increased toward the buffer layer. Forming a thick electron transit layer having a high In composition ratio (z) generates deformation, but the deformation can be reduced by making an In composition ratio (z) low near the interface with the buffer layer and increasing the In composition ratio toward the mitigation layer. With a higher In composition ratio (z), larger drain current flows. In the case that an In composition ratio (z) of the electron transit layer is increased toward the mitigation layer, an In composition ratio (z) is preferably above 0.1 and below 0.5 in the first embodiment, and in the second embodiment an In composition ratio (z) is above 0.3 and below 0.7.

In the first and the second embodiments, the electron transit layer is doped with an n-impurity so as to flow large drain current, and a concentration of the impurity is below $2 \times 10^{18}$ cm$^{-3}$.

What is claimed is:

1. A compound semiconductor device comprising:
   a semi-insulating GaAs substrate;
   an electron transit layer of an InGaAs layer formed on the substrate;
   a mitigation layer formed on the electron transit layer, and being an AlGaInAs layer; and
   a barrier layer formed on the mitigation layer, being an AlGaAs layer, and having a higher Al composition ratio than the mitigation layer;
   wherein the mitigation layer is an $(Al_xGa_{1-x})_yIn_{1-y}As$ layer which has an Al composition ratio x above 0.1 and below 0.5, and an In composition ratio y is above 0.9 and below 1.0, and
   the barrier layer is an $Al_xGa_{1-x}As$ layer which has an Al composition ratio x above 0.4 and below 0.8.

2. A compound semiconductor layer comprising:
   a semi-insulating InP substrate;
   an electron transit layer formed on the substrate, and being an InGaAs layer;
   a mitigation layer formed on the electron transit layer, and being an AlGaTnAs layer; and
   a barrier layer formed on the mitigation layer, being an AlInAs layer, and having a higher Al composition ratio than the mitigation layer,
   wherein the mitigation layer is an $(Al_xGa_{1-x})_yIn_{1-y}As$ layer which has an Al composition ratio x above 0.1 and below 0.35, and an In composition ratio y is above 0.3 and below 0.7, and
   the barrier layer is an $Al_xIn_{1-x}As$ layer which has an Al composition ratio x above 0.3 and below 0.7.

3. A compound semiconductor device according to claim 1, wherein
   the mitigation layer is as thin as about 10 nm, and
   the barrier layer is as thin as about 20 nm.

4. A compound semiconductor device according to claim 2, wherein
   the mitigation layer is as thin as about 10 nm, and
   the barrier layer is as thin as about 40 nm.

5. A compound semiconductor device according to claim 1, wherein
   the barrier layer is doped with no impurity.

6. A compound semiconductor device according to claim 2, wherein
   the barrier layer is doped with no impurity.

7. A compound semiconductor device according to claim 1, wherein
   the barrier layer is doped with an p-impurity, and a concentration of the impurity is below $1 \times 10^{19}$ cm$^{-3}$.

8. A compound semiconductor device according to claim 2, wherein
   the barrier layer is doped with an p-impurity, and a concentration of the impurity is below $1 \times 10^{19}$ cm$^{-3}$.

9. A compound semiconductor device according to claim 1, wherein
   the electron transit layer has an In composition ratio increased toward the mitigation layer.

10. A compound semiconductor device according to claim 2, wherein
    the electron transit layer has an In composition ratio increased toward the mitigation layer.

11. A compound semiconductor device according to claim 1, wherein
    the electron transit layer is doped with an n-impurity, and a concentration of the impurity is below $2 \times 10^{18}$ cm$^{-3}$.

12. A compound semiconductor device according to claim 2, wherein
    the electron transit layer is doped with an n-impurity, and a concentration of the impurity is below $2 \times 10^{18}$ cm$^{-3}$.

* * * * *